US006620752B2

(12) United States Patent
Messing et al.

(10) Patent No.: US 6,620,752 B2
(45) Date of Patent: Sep. 16, 2003

(54) METHOD FOR FABRICATION OF LEAD-BASED PEROVSKITE MATERIALS

(75) Inventors: Gary L. Messing, State College, PA (US); Songtae Kwon, State College, PA (US); Edward M. Sabolsky, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 163 days.

(21) Appl. No.: 09/939,297

(22) Filed: Aug. 24, 2001

(65) Prior Publication Data

US 2002/0193237 A1 Dec. 19, 2002

Related U.S. Application Data

(63) Continuation-in-part of application No. PCT/US01/06606, filed on Mar. 1, 2001.
(60) Provisional application No. 60/186,151, filed on Mar. 1, 2000.

(51) Int. Cl.$^7$ ............................................. C04B 35/472

(52) U.S. Cl. ................................ 501/136; 252/62.9 PZ

(58) Field of Search .................... 501/136; 252/62.9 PZ

(56) References Cited

U.S. PATENT DOCUMENTS

| | | |
|---|---|---|
| 4,233,282 A | 11/1980 | Arendt |
| 4,534,956 A | 8/1985 | Arendt et al. |
| 4,812,426 A | 3/1989 | Takagi et al. |
| 5,096,642 A | 3/1992 | Shirasaki |
| 5,270,293 A | 12/1993 | Schulze et al. |
| 5,795,537 A | 8/1998 | Senna et al. |
| 6,093,338 A | 7/2000 | Tani et al. |
| 6,136,229 A | 10/2000 | Cui et al. |

FOREIGN PATENT DOCUMENTS

| | | |
|---|---|---|
| JP | 10-114570 | 5/1998 |
| JP | 2000-203935 | 7/2000 |

OTHER PUBLICATIONS

Arendt et al., The Molten Salt Synthesis of Large Crystal–Sized SrTiO$_3$ Ceramic Electrolyte Cells, vol. 134, No. 3, pp. 733–736 (1987). No month provided.
Fukuchi et al, Oriented Bi$_{0.5}$(Na, K)$_{0.5}$TiO$_3$ Ceramics, Perovskite Oxides, pp. 227–233, (No date provided).
Horn et al, Templated grain growth of textured bismuth titanate, J. Am. Ceram. Soc. (Apr. 1999,) pp. 921–926.
Kimura et al., Products of Reaction Between PbO and Nb$_2$O$_5$ in Molten KCl or NaCl, Communications of the American Ceramic Society, (1983) No month provided, pp. C195–197.
Li et al, Heteroepitaxial growth of bulk single–crystal Pb(Mg$_{1/3}$Nb$_{2/3}$)O$_3$–32mol%PbTiO$_3$ from (111) SrTiO$_3$, J. Mater. Res., (Aug. 1999) pp. 3189–3191.

Moon et al, "Oriented Lead Titanate Film Growth at Lower Temperatures by the Sol–Gel Method on Particle–Seeded Substrates," J. Am. Ceram. Soc., 80, 2613–23 (1997). No month provided.
Park et la, Ultrahigh stain and piezoelectric behavior in relaxor based ferroelectric single crystals, J. Appl. phys. (Aug. 15, 1997) p. 1804–11.
Seabaugh et al, "Texture Development by Templated Grain Growth in Liquid–phase–Sintered α–Alumina," J. Am. Ceram. Soc., 80, 1181–88 (1997). No month provided.
Takeuchi et al., Piezoelectric Properties of Bismuth Layer–Structured Ferroelectric Ceramics with a Preferred Orientation Processed by the Reactive Templated Grain Growth Method, Jpn. J. Appl. Phys. vol. 38(1999) pp. 5553–5556 (Sep. 1999).
Takeuchi et al., Texture Engineering of Lead–containing Perovskite–type Ceramics by RTGG Method, Electronic Ceramics in Japan, vol. 4, (No date provided).
Wang et al., Mechanochemical fabrication of single phase PMN of perovskite structure, Solid State Ionics 124 (1999), No month provided, pp. 271–279.
Watari et al., Epitaxial Growth of Anistropically Shaped, Single–Crystal Particles of Cubic SrTiO$_3$, J. Mater. Res. vol. 15, No. R, (Apr. 2000) pp. 846–849.
Duran, et al., Fabrication and Electrical Properties of Textured Sr$_{0.53}$Ba$_{0.47}$Nb$_2$O$_6$ Ceramics by Templated Grain Growth,, J. Am. Ceram. Soc. vol. 83, No. 9, pp. 2203–2213. No date provided.
Guha, Reaction, Chemistry and Subsolidus Phase Equilibria in Lead–Based Relaxor Systems: Part One, J. Materials Science pp. 4985–4994 (1999). No month provided.
Han et al., New Preparation Method of Low–temperature Sinterable Pb(Mg$_{1/3}$Nb$_{2/3}$)O$_3$ Powder and its Dielectric Properties, J. Materials Science pp. 2055–2059 (2000). No month provided.
Harada, et al., Crystal Growth and Electrical Properties of Pb((Zn$_{1/3}$Nb$_{2/3}$)$_{0.91}$Ti$_{0.09}$)O$_3$ Single Crystals Produced by Solution Bridgman Method, J. Am. Ceram. Soc. 81[11] pp. 2785–2788 (1998). No month provided.
Hong et al., Anistropic Grain Growth in Seeded and B$_2$O$_3$–Doped Diphasic Mullite Gels, J. European Ceramic Society pp. 133–141 (1996). No month provided.

(List continued on next page.)

Primary Examiner—David Brunsman
(74) Attorney, Agent, or Firm—Law Offices of John A Parrish

(57) ABSTRACT

The disclosed invention relates to PMN compounds, powders and products thereof, especially to PMN-PT compounds, powders and products which have the perovskite structure. The PMN-PT compounds are characterized by the formula $(1-x)Pb(Mg_{1/3}Nb_{2/3})O_3-xPbTiO_3$ where x is about 0.0 to about 0.95, preferably x is about 0.0 to about 0.40. The compounds are made by sintering a precursor powder of the compound. PMN-PT products produced from the precursor powders have much greater densities than products produced from PMN-PT starting powder. The invention also relates to textured PMN-PT produced from the precursor powders.

34 Claims, No Drawings

OTHER PUBLICATIONS

Kwon, et al., Low–temperature Reactive Sintering of 0.65 PMN–0.35 PT, J. Am. Ceram. Soc. 84[3] pp. 648–650 (2001). No month provided.

Lee, et al., Growth and Electrostrictive Properties of $Pb(Mg_{1/3}Nb_{2/3})O_3$ Crystals, Applied Physics, pp. 1030–1032 Letters, 15 (Feb. 1999).

Li, et al., Single Crystals of $Pb(Mg_{1/3}Nb_{2/3})O_3$–35 mol% $PbTiO_3$ from Polycrystalline Precursors, J. Am. Ceram. Soc. 81[1] pp. 244–248 (1998). No month provided.

Lu et al., Simultaneous Synthesis and Sintering of Lead Magnesium Niobate Ferroelectric Ceramics, Materials Science and Engineering B64 pp. 195–198 (1999) No month provided.

Park, et al., Characteristics of Relaxor–based Piezoelectric Single Crystals for Ultrasonic Transducers, IEEE Transactions on Ultrasonic Ferroelectrics, vol. 44, No. 5 (Sep. 1997).

Rehrig, et al., Templated Grain Growth of Barium Titanate Single Crystals, J. Am. Ceram. Soc. 83[11] pp. 2654–2660 (2000) No month provided.

Rehrig, et al., Piezoelectric Properties of Zirconium–doped Barium Titanate Single Crystals Grown by Templated Grain Growth, Journal of Applied Physics, pp. 1657–1661, 1 (Aug. 1999).

Sabolski et al., Piezoelectric Properties of <001> Textured $Pb(Mg_{1/3}Nb_{2/3})O_3$–$PbTiO_3$ Ceramics, Applied Physics Letters, pp. 2551–2553, 23 (Apr. 2001).

Shrout, et al., Conventionally Prepared Submicrometer Lead–based Perovskite Powders by reactive Calcination, J. Am. Ceram. Soc., [7] pp. 1862–1867 (1990) no month provided.

Swartz, et al., Fabrication of Perovskite Lead Magnesium Niobate, Materials Research Bulletin, vol. 17, pp. 1245–1250 (1982). No month provided.

Yoshikawa et al., Chemical Preparation of Lead–containing Niobate Powders, J. Am. Ceram. Soc., pp. 2417–2421 (1996). No month provided.

Baek et al, Synthesis of Pyrochlore–Free $0.9Pb(Mg_{1/3}Nb_{2/3})O_3$–$0.1PbTiO_3$ Ceramics via a Soft Mechanochemical Route, J. Am. Cer. Soc., pp. 973–981 (Apr. 1, 1997).

METHOD FOR FABRICATION OF LEAD-BASED PEROVSKITE MATERIALS

This is a continuation in part of international application PCT/US01/06606 having an international filing date of Mar. 1, 2001.

FIELD OF THE INVENTION

The present invention relates to lead magnesium niobate perovskite compounds. More particularly, the invention relates to lead magnesium niobate-lead titanate solid solution compounds and products thereof. The present invention also relates to textured lead magnesium niobate-lead titanate solid solution compounds.

BACKGROUND OF THE INVENTION

Ceramic compounds which have a perovskite crystal structure have numerous commercial applications. These applications include: dielectric materials for capacitors; piezoelectric materials for transducers and sensors; electrostrictive materials for micropositioners and actuator devices; and transparent electrooptic materials for information storage and optical signal processing.

The perovskite structure, as typified by $BaTiO_3$ above 135° C., is cubic. This structure is a regular array of oxygen ions at the face centers, small tetravalent titanium ions in the center, and big, divalent barium ions located at the corners. The perovskite structure in ferroelectric compounds is distorted at low temperatures and exhibits tetragonal, orthorhombic, or rhombohedral symmetry. At higher temperatures, the structure transforms to cubic. The transition temperature at which the distorted phase transforms to the cubic phase is called the Curie point. The ferroelectric behavior is caused by distortions in the crystal lattice caused by shifts in the position of the central cation.

A relatively new class of ferroelectric materials is PbO-based complex perovskite corresponding to the formula $Pb(B_1,B_2)O_3$. The $B_1$ cation can be one of several low valence cations such as $Mg^{2+}$, $Zn^{2+}$, $Ni^{2+}$, and $Fe^{3+}$, and the $B_2$ cation can be one of several higher valence cations such as $Nb^{5+}$, $Ta^{5+}$, and $W^{5+}$. These ferroelectrics have promise for dielectrics such as ceramic capacitors, piezoelectrics, and electrostrictive actuators (e.g., micropositioner) applications, depending on composition.

Ceramic processing of ferroelectrics of lead magnesium niobate ("PMN") by conventional milling and calcination techniques is difficult. For example, it is extremely difficult to produce $PbMg_{1/3}Nb_{2/3}O_3$ by conventional mixed oxides processing due to formation of a stable Pb-niobate pyrochlore phase during calcination. Repeated calcination at high temperature (1000° C.) is required to form PMN powder. Moreover, at these high temperatures, the volatility of PbO alters stoichiometry and prevents complete reaction. As a result, excess PbO is required.

Several processing steps are required to form a PMN powder into a shape and to densify it into a functional electrical ceramic element. The powder first is formed into a green body such as by dry pressing. The green body then is densified by sintering. Sintering is a key aspect of the manufacturing process and must be controlled to produce uniform, dense ceramic products. The uniformity and density of the products produced, however, are highly dependent on the ceramic powder employed.

Lead-based relaxor ferroelectric-$PbTiO_3$ solid solutions of the perovskite crystal structure which have the general formula $Pb(B_1B_2)O_3$—$PbTiO_3$, ("PMN-PT")where $B_1$ can be any of Zn, Mg, Sc, Ni, Yb, Fe, Co, Cu, and Cd and $B_2$ is any of Nb, Ta, Ti, Zr, Hf, and W have excellent dielectric and electromechanical properties. Compounds of this formula which are slightly on the rhombohedral side of the morphotropic phase boundary (MPB) between the tetragonal and rhombohedral phases have excellent dielectric and electromechanical properties. For example, the compound 0.67PMN-0.33PT (67PMN-33PT) which is slightly on the rhombohedral side of the MPB has a longitudinal piezoelectric coefficient ($d_{33}$) as high as 640–700 pC/N. Also it is known that <001> oriented cuts of single crystal 65PMN-35PT have piezoelectric coefficients ($d_{33}$) >1500 pC/N and longitudinal electromechanical coupling coefficients ($k_{33}$) >0.9. See Park et al., *IEEE Transactions on Ultrasonics, Ferroelectrics, and Frequency Control*, vol. 44, pp. 1140, 1997.

These properties of PMN-PT type ceramics have spawned renewed interest in growing PMN-PT type ceramics because of their potential for improving the performance of transducers and actuators.

Various methods have been used to grow lead-based ferroelectric single crystals. Typically, these methods employ the high-temperature flux process and the Bridgeman method. These methods, however, have not been satisfactory. For example, the high-temperature flux process has suffered the disadvantage of difficulty of control over the crystallographic growth direction of the single crystals, as well as control of the size of the single crystals produced. In addition, the Bridgman method suffers the disadvantage of poor control over the chemical uniformity of the crystals produced. In addition to these disadvantages, each of these methods requires excess PbO to enhance crystal growth. Excess PbO, however, can limit the properties attainable in the single crystals as well as cause processing difficulties. As a result, control over the chemical uniformity of the PMN-PT crystals is expensive and difficult.

A need therefore exists for a method of manufacture of PMN-PT type textured ceramics which overcome these disadvantages. A need also exists for ceramic powders useful in manufacture of uniform, dense ferroelectrics such as those based on PMN, particularly those based on solid solutions of PMN and lead titanate ("PT").

SUMMARY OF THE INVENTION

The present invention relates to PMN compounds, powders and products thereof, especially to PMN-PT compounds, powders and products which have the perovskite structure.

The PMN-PT compounds are characterized by the formula $(1-x)Pb(Mg_{1/3}Nb_{2/3})O_3-xPbTiO_3$ where x may vary from about 0.0 to about 0.95, preferably about 0.0 to about 0.40. More preferably, x is about 0.35. The formula $(1-x)Pb(Mg_{1/3}Nb_{2/3})O_3-xPbTiO_3$ also can be expressed as $(1-x)PMN-xPT$ where x may vary from about 0.0 to about 0.95, preferably about 0.0 to about 0.40. More preferably x is about 0.35.

In a first aspect, the invention relates to preparing lead magnesium niobate-lead titanate compounds of the formula $(1-x)Pb(Mg_{1/3}Nb_{2/3})O_3-xPbTiO_3$ where x=0.0–0.95. The method entails mixing a blend including a source of lead oxide with magnesium niobate and fumed titanium oxide to form a mixture. Examples of useful sources of lead oxide include lead acetates-lead hydroxides such as $Pb(CH_3COO)_2Pb(OH)_2$, lead acetates such as $Pb(CH_3COO)_4$, lead carbonate-hydroxides such as $(PbCO_3)_2$ Pb(OH)$_2$, and lead carbonates such as PbCO$_3$. The mixture is milled to produce a blend of a particle size less than about 3 μm. Preferably, milling is performed by ball milling in distilled water. The blend is heat treated to produce a dried precursor powder. The dried precursor powder is sintered at about 900° C. to about 1300° C. to produce a lead magnesium niobate-lead titanate compound.

In a further aspect, the blend may include an oxide of any of Zr, Ta, La, Fe, Mn, Ni, Zn, and W and mixtures thereof. The blend also may include a binder such as polyvinyl alcohol, polyethylene glycol, methylcellulose, carboxymethylcellulose, ethylcellulose, hydroxypropylcellulose, polyethylene oxide base high polymers, acrylic base high polymers, maleic anhydride base high polymers, starch, gelatine, polyoxyethylene alkyl ether, polyvinyl butyrol and waxes.

In another aspect, the invention relates to a process for manufacture of 0.65PMN-0.35PT ceramics such as 0.65PMN-0.35PT single crystals. The process entails mixing (PbCO$_3$)$_2$Pb(OH)$_2$ of a particle size of less than about 6 μm, MgNb$_2$O$_6$ having a specific is surface area of more than about 5 m$^2$/g and fumed TiO$_2$ having a specific surface area of more than about 30 m$^2$/g to form a mixture. The(PbCO$_3$)$_2$Pb(OH)$_2$, fumed TiO$_2$, and MgNb$_2$O$_6$ are present in amounts sufficient to produce a ratio of (PbCO$_3$)$_2$Pb(OH)$_2$:MgNb$_2$O$_6$:fumed TiO$_2$ of about 1:0.24:0.1 to about 1:0.0.27:0.12. The mixture is milled in distilled water to produce a slurry having particle size of less than about 3 μm. The slurry is heat treated to produce a dried precursor powder. The dried precursor powder is ground and sieved to a size less than about 200 μm and compressed to produce a preform. A barium titanate single crystal template is placed on the compressed preform and an additional amount of the dried precursor powder is placed over the barium titanate single crystal. The preform having the barium titanate single crystal and dried precursor powder thereon is compressed to produce a compact. The compact is sintered whereby oriented 0.65PMN-0.35PT ceramics such as 0.65PMN-0.35PT single crystals form on the barium titanate single crystal template. Preferably, sintering is performed at 1150° C. in 99% pure oxygen for one hour followed by sintering at 1150° C. in nitrogen for ten hours.

This aspect of the invention advantageously enables manufacture of dense PMN-PT compounds without the requirement of the prior art to calcine dried powder and to subsequently re-mill the calcined powder.

This aspect of the invention also advantageously enables manufacture at low temperatures of dense products which have fine microstructures. In addition, this aspect of the invention advantageously enables manufacture of PMN-PT solid solution compounds without the need to use excess PbO as in the prior art.

In another aspect of the invention, templated grain growth (TGG) using {001} SrTiO$_3$ single crystal templates are employed to produce textured, PMN$_{(1-x)}$-PT$_x$ ceramics where x=0–1, preferably, about 0.325 to 0.35, most preferably about 0.325, in directions such as, the <001> direction.

TGG entails growing oriented PMN-PT single crystals onto {001} SrTiO$_3$ single crystal templates dispersed within a PMN-PT precursor matrix. The amount of the {001} SrTiO$_3$ templates in the PMN-PT precursor matrix may vary from about 1 vol % to about 10 vol %, preferably about 5 vol % based on the volume of PMN-PT ceramic product produced. The size of the {001} SrTiO$_3$ templates employed may vary from about 1 μm to about 50 μm in edge length, preferably about 5 μm to about 25 μm in edge length. The aspect ratio of length to thickness of the {001} SrTiO$_3$ templates may vary from about 2 to 100, preferably about 3 to about 30, most preferably about 5 to 20.

This aspect of the invention advantageously enables use of {001} SrTiO$_3$ templates and a PMN-PT precursor matrix to produce textured PMN-PT ceramics such as <001> textured PMN-PT ceramics.

The densities of the <001> textured PMN-PT ceramics produced by this aspect of the invention advantageously are >98%, preferably >99% of theoretical density.

Having summarized the invention, the invention will now be described in detail by reference to the following detailed description and non-limiting examples.

DETAILED DESCRIPTION OF THE INVENTION

In manufacture of PMN-PT compounds, a source of lead oxide is mixed with fumed TiO$_2$ and MgNb$_2$O$_6$ to produce a blend. Examples of sources of lead oxide include but are not limited to lead acetates-lead hydroxides, lead acetates, lead hydroxides, and lead carbonates. Lead acetates-lead hydroxides may include Pb(CH$_3$COO)$_2$Pb(OH)$_2$; lead acetates may include Pb(CH$_3$COO)$_4$; lead hydroxides may include Pb(OH)$_2$. Preferably, the source of lead oxide is (PbCO$_3$)$_2$Pb(OH)$_2$.

The (PbCO$_3$)$_2$Pb(OH)$_2$ is mixed with fumed TiO$_2$ and MgNb$_2$O$_6$ to produce a blend. The blend may be milled such as by jet milling or ball milling. Preferably, the blend is ball milled in the presence of a liquid to produce a slurry of particles and liquid. More preferably, ball milling is performed for about 1 h to about 10 hours. The purity of the (PbCO$_3$)$_2$Pb(OH)$_2$ employed may vary from about 98% to about 99.99% pure, preferably about 99% to about 99.9% pure, most preferably about 99.9% pure. The particle size of the (PbCO$_3$)$_2$Pb(OH)$_2$ can be less than about 6 μm, preferably less than about 5 μm, more preferably less than about 4 μm. The specific surface area ("SSA") of the fumed TiO$_2$ can be more than about 30 m$^2$/g, preferably more than about 40 m$^2$/g, more preferably more than about 50 m$^2$/g. The SSA of the MgNb$_2$O$_6$ can be more than about 5 m$^2$/g, preferably more than about 6 m$^2$/g, more preferably about 7.5 m$^2$/g. The ratios of amounts of (PbCO$_3$)$_2$Pb(OH)$_2$, fumed TiO$_2$ and MgNb$_2$O$_6$ for manufacture of 0.65PMN-0.35PT can vary. Examples of useful ratios of amounts of (PbCO$_3$)$_2$Pb(OH)$_2$:MgNb$_2$O$_6$:fumed TiO$_2$ are about 1:0.24:0.1 to about 1:0.0.27:0.12, preferably about 1:0.25:0.1 to about 1:0.26:0.12, more preferably about 1:0.256:0.109.

Various liquids may be used in ball milling. Examples of useful liquids include alcohols such as ethyl alcohol, isopropyl alcohol, acetone, deionized water, and distilled water, preferably distilled water and deionized water. Examples of milling balls which may be employed include yittria stabilized zirconia balls and alumina balls.

The weight ratio of liquid to particles in the slurry can vary from about 1:0.5 to about 1:0.32. Preferably the weight ratio of liquid to particles in the slurry is about 1:0.32.

Ball milling of the mixture of (PbCO$_3$)$_2$Pb(OH)$_2$, fumed TiO$_2$ and MgNb$_2$O$_6$ is continued to produce a slurry which has a particle size less than about 3 μm, preferably less than about 2 μm, more preferably less than about 1 μm in size.

After ball milling, the slurry is heated at about 50° C. to about 120° C., preferably about 60° C. to about 100° C., more preferably about 70° C. to about 90° C., most preferably about 80° C., with stirring to produce a dried PMN-PT precursor powder. The dried precursor powder is ground and sieved to less than about 200 μm, preferably less than about 150 μm, more preferably less than about 90 μm. The dried precursor powder is compressed by uniaxial or isostatic pressure to produce a compact. The compact then is isostatically compressed to produce a green preform. Uniaxial pressing may be done at about 5 MPa to about 100 MPa, preferably about 5 MPa to about 50 MPa, more preferably about 5 MPa to about 20 MPa. Isostatic pressing may be done at about 100 MPa to about 400 MPa, preferably about 100 MPa to about 350 MPa, more preferably about 100 MPa to about 300 Mpa.

The green preform then is sintered. During sintering, the green preform is encapsulated in Nobel metal foil such as Pt and placed into an embedding powder. Embedding powders which may be used include lead containing powders such as lead oxide, lead magnesium niobate, and lead zirconium niobate. These powders are capable of surrounding the preform with an atmosphere of lead oxide during sintering. In manufacture of PMN-PT compounds, the embedding powder preferably has about 1% more PbO than the PMN-PT composition of the green preform. More preferably, the powder has the same composition as the green preform.

The embedding powder preferably has a composition identical to the green preform to provide an atmosphere of lead oxide around the green preform. Where the embedding powder has a composition identical to that of the green preform, encapsulation of the green preform in the noble metal foil is optional.

The green preform can be sintered in oxygen, nitrogen, or air. In a preferred aspect, the preform is sintered in oxygen, preferably 95% pure oxygen, more preferably 99% pure oxygen. In another preferred aspect, the preform is sintered in oxygen and then in nitrogen. During sintering, the green preform may be heated at about 3° C. to about 20° C./min, preferably about 5° C. to about 15° C./min, more preferably about 10° C. to about 15° C./min, most preferably about 15° C./min.

Sintering temperatures can vary from about 900° C. to about 1300° C., preferably about 1000° C. to about 1200° C., more preferably about 1000° C. to 1150° C. The time periods at which the preform is held at the sintering temperature can be up to about 50 hours, preferably about 0.5 to about 20 hours, more preferably about 1 to about 10 hours.

EXAMPLES 1–3

Manufacture of 0.65PMN-0.35PT that Has the Perovskite Crystal Structure

EXAMPLE 1

51.6 g (PbCO$_3$)$_2$Pb(OH)$_2$ of 99.9% purity from Aldrich Chemical Co. that has an average particle size of 3.7 μm is blended with 13.2 g MgNb$_2$O$_6$ of 99.9% purity from H.C. Starck Co. which has a specific surface area of 7.43 m$^2$/g and with 5.6 g fumed TiO$_2$ from Degussa Corp. that has a specific surface area of 50 m$^2$/g to produce a blend. The blend is ball milled for 10 h with 700 gm of 3 mm diameter yittria stabilized ZrO$_2$ balls from Tosoh Corp. Ball milling is done in 220 ml deionized water in a 500 ml, high density polyethylene bottle to produce a slurry.

After ball milling, the slurry is placed in a glass beaker and heated on a hot plate at 80° C. for 12 hours in air while stirring with a magnetic stirrer. The resulting material then is dried at 80° C. in an oven for 5 hours in air to produce a dried precursor powder of 0.65PMN-0.35PT. The precursor powder is considered dry when the absorbed water content remaining in the powder is less than about 0.3% by weight of the powder, or when chemically bound water is less than about 1.7% by weight of the powder. The dried precursor powder is ground and sieved to a particle size of –170 mesh, that is, less than 90 μm.

The dried precursor powder in an amount of 0.3 g is placed into a quarter inch diameter die and uniaxially compressed at 5 MPa to produce a compact. The compact is isostatically pressed at 280 MPa to produce a green preform that has a density of 4.13 g/cc.

The green preform is encapsulated in platinum foil. The encapsulated green preform is placed in an embedding powder of the same composition as the green preform in an alumina boat. The green preform is sintered in 99% pure oxygen in a tube furnace. During sintering, the preform is heated at 15° C./min to a temperature of 1000° C. The preform is held at 1000° C. for one hour to produce a sintered product of 0.65PMN-0.35PT.

EXAMPLE 2

The procedure of example 1 is repeated except that the preform is held at 1000° C. for 4 hours.

EXAMPLE 3

The procedure of example 1 is repeated except that the preform is held at 1000° C. for 11 hours.

The densities of the sintered products produced in examples 1–3 are shown in column 3 of Table 1.

Comparison Examples 1C–3C

For comparison, the procedure of example 1 is repeated except that commercially available 0.65PMN-0.35PT powder of a particle size of 1.33 μm from TRS Corp. is compressed to make the green preform which is sintered. The densities of the sintered products produced from the commercially available 0.65PMN-0.35PT powder are shown in column 4 of Table 1.

TABLE 1

Sintered Densities

| Example | Sintering Time in 99% Pure Oxygen (hours) | Sintered Density of 0.65 PMN–0.35 PT from Powder of Invention (g/cc) | Sintered Density from Commercial 0.65 PMN–0.35 PT Perovskite Powder (g/cc) |
|---|---|---|---|
| 1 | 1 | 8.075 | — |
| 2 | 4 | 8.126 | — |
| 3 | 11 | 8.136 | — |
| 1C | 1 | — | 7.902 |
| 2C | 4 | — | 8.009 |
| 3C | 11 | — | 7.972 |

The results in Table 1 show that the dried precursor powders as in of the invention sinter to produce PMN-PT ceramic products which have greater densities than the products produced from commercial PMN-PT powders such as commercial perovskite 0.65PMN-0.35PT powder. In addition to greater densities, the microstructure of the sintered products produced from the dried PMN-PT precursor powders is more dense and more fine than that produced from sintering of commercial PMN-PT perovskite powder.

EXAMPLES 4–13

These Examples Illustrate the Effect of Temperature, Time and Atmosphere on Sintered Density

EXAMPLE 4

The procedure of example 1 is followed except that the green preform is heated to a sintering temperature of 1150° C. in 99% pure oxygen, and then immediately cooled.

EXAMPLE 5

The procedure of example 4 is followed except that the preform is maintained at a sintering temperature of 1150° C. in oxygen for 0.5 hours prior to cooling.

EXAMPLE 6

The procedure of example 4 is followed except that the preform is maintained at a sintering temperature of 1150° C. in air for 0.5 hour prior to cooling.

EXAMPLE 7

The procedure of example 4 is followed except that the preform is maintained at a sintering temperature of 1150° C. in 99% pure oxygen for 1 hour prior to cooling.

EXAMPLE 8

The procedure of example 4 is followed except that the preform is maintained at a sintering temperature of 1150° C. in 99% pure oxygen for 1 hour prior to changing the atmosphere to nitrogen. The preform is sintered at 1150° C. in nitrogen for 1 hour prior to cooling.

EXAMPLE 9

The procedure of example 4 is followed except that the preform is maintained at a sintering temperature of 1150° C. in 99% pure oxygen for 1 hour prior to changing the atmosphere to nitrogen. The preform is sintered at 1150° C. in nitrogen for 3 hours prior to cooling.

EXAMPLE 10

The procedure of example 4 is followed except that the preform is maintained at a sintering temperature of 1150° C. in 99% pure oxygen for 4 hours prior to cooling.

EXAMPLE 11

The procedure of example 4 is followed except that the preform is maintained at a sintering temperature of 1150° C. in air for 6 hours prior to cooling.

EXAMPLE 12

The procedure of example 4 is followed except that the preform is maintained at a sintering temperature of 1150° C. in 99% pure oxygen for 1 hour prior to changing the atmosphere to nitrogen. The preform is sintered at 1150° C. in nitrogen for 10 hours prior to cooling.

EXAMPLE 13

The procedure of example 4 is followed except that the preform is maintained at a sintering temperature of 1150° C. in 99% pure oxygen for 11 hours prior to cooling.

The densities of the sintered products produced as in examples 4–13 are measured by the Archimedes method. The results are shown in Table 2.

TABLE 2

Effect of Sintering Atmosphere on Sintered Density

| Example | Total Sintering Time (Hours) at 1150° C. | Density Produced by Sintering in Oxygen followed by Nitrogen (g/cc) | Density Produced by Sintering in 99% Pure Oxygen (g/cc) | Density Produced by Sintering in Air (g/cc) |
|---|---|---|---|---|
| 4 | 0 | — | 7.840 | — |
| 5 | 0.5 | — | 8.082 | — |
| 6 | 0.5 | — | — | 7.962 |
| 7 | 1 | — | 8.116 | — |
| 8 | 2 | 8.093 | — | — |
| 9 | 4 | 8.100 | — | — |
| 10 | 4 | — | 8.080 | — |
| 11 | 6 | — | — | 7.900 |
| 12 | 11 | 8.140 | — | — |
| 13 | 11 | — | 8.094 | — |

The microstructures of the sintered products of examples 4, 5, 7–10, 12 and 13 are free of pores at the grain boundaries. In contrast, the products of examples 6 and 11 have pores at the grain boundaries.

EXAMPLE 15

Manufacture of 0.70PMN-0.30PT That Has the Perovskite Crystal Structure

The procedure of example 1 is repeated except that the amount of $(PbCO_3)_2Pb(OH)_2$ is 48.259 g, the amount of $MgNb_2O_6$ is 13.2 g and the amount of fumed $TiO_2$ is 4.43 g.

EXAMPLE 16

Manufacture of 0.68MN-0.32PT That Has the Perovskite Crystal Structure

The procedure of example 1 is repeated except that the amount of $(PbCO_3)_2Pb(OH)_2$ is 48.774 g, the amount of $MgNb_2O_6$ is 12.993 g and the amount of fumed $TiO_2$ is 4.899 g.

EXAMPLE 17

This Example Illustrates Manufacture of Single Crystal 0.65PMN-0.35PT

Barium titanate single crystals grown by the Remeika salt process are used for the seed particle to grow 0.65PMN-0.35PT single crystal. In the Remeika salt process, the barium titanate single crystal is made by mixing 18.3 g of KF from Acros Chemical with 8.79 g $BaTiO_3$ from Cabot Performance Materials in a 40-ml platinum crucible. The resulting mixture is heated at 10° C./min to a 1100° C. in air. The mixture is held at 1100° C. for 240 minutes, cooled to 850° C. over a period of 720 min, and then quenched in air at room temperature. Residual KF is removed by washing with deionized water. The resulting barium titanate single crystal then is cut to measure 2 mm×2 mm×0.1 mm.

0.15 g of the dried precursor powder prepared as in example 1 is filled into a quarter inch diameter die and uniaxially compressed at 0.5 MPa to form a green pellet. The 2 mm×2 mm×0.1 mm size $BaTiO_3$ single crystal produced above is placed on the green pellet while in the die. An additional 0.15 g of the same dried precursor powder is poured into the die over the $BaTiO_3$ single crystal. The pellet with powder and $BaTiO_3$ single crystal is uniaxially compressed at 5 MPa to produce a compact. The compact then is isostatically compressed at 280 MPa to yield a green preform. The green preform is sintered as in example 4. A 0.65PMN-0.35PT single crystal is formed on the BaTiO$_3$ crystal. The size of the 0.65PMN-0.35PT single crystal is measured by scanning electron microscopy.

EXAMPLE 17C

For comparison, the procedure of example 17 is followed except that commercial 0.65PMN-0.35PT perovskite powder from TRS of example 1C is substituted for the dried precursor powder employed in example 17.

Comparison of the sizes of the 0.65PMN-0.35PT single crystal grown with the 0.65PMN-0.35PT with the precursor material of the invention with the single crystal grown with the commercial 0.65PMN-0.35PT perovskite material shows that the single crystal grown with the precursor material of the invention is significantly larger. The 0.65PMN-0.35PT single crystal grown by use of the precursor powder of the invention is an order of magnitude greater than the 0.65PMN-0.35PT single crystal produced from the commercial 0.65PMN-0.35PT perovskite powder.

As an alternative to use of BaTiO$_3$ single crystal templates, PbTiO$_3$ single crystal templates may be used. PbTiO$_3$ single crystal templates can be grown by the following procedure:

An aqueous 0.5 M stock Pb-acetate (Pb(CH$_3$COO)$_2$) (Aldrich Chemical Co.) solution was made in de-ionized water. A stock 0.5 M Ti-isopropoxide (Ti(OPr$^i$)$_4$) (Aldrich Chemical Co.) solution in ethanol was prepared and stored in an argon filled glove-box. KOH was then added to de-ionized water to form a 2 M stock KOH solution. 0.1 wt % polyvinyl alcohol (PVA) was added to the KOH stock solution.

The Ti-isopropoxide solution was added to the Pb-acetate solution in a 21 ml. Teflon-lined Parr hydrothermal autoclave (Parr Instrument Company, Moline, Ill.) at a Pb/Ti ratio=1.4. The 2 M KOH solution was added to the Parr autoclave until the pH was 13.8. The addition of the KOH produced a thick yellowish-white gel in the Parr autoclave. The gel filled 50 vol % of the Teflon autoclave cell. The Parr autoclave was sealed and heated to 165° C. for 5 h. The resultant powdered cake was filter-washed with de-ionized water. The pH of the wash water was altered to ~10 by NH$_4$OH to decrease Pb leaching from the PbTiO$_3$ particles during washing. The PbTiO$_3$ fibers are <1 µm in diameter and between 10–20 µm in length. The acicular particles crystal structure changed to the tetragonal PbTiO$_3$ structure above 650° C. without altering the morphology of the particles.

EXAMPLES 18–19

These Examples Shows the Effect of Sintering Atmosphere on 0.65PMN-0.35PT Single Crystal on BaTiO$_3$ Single Crystal Template

EXAMPLE 18

A green preform is prepared as in Example 17. The preform is sintered at 1150° C. for 1 hour in oxygen followed by sintering at 1150° C. for 10 hours in nitrogen.

The 0.65PMN-0.35PT single crystal ceramics produced have a perovskite crystal structure and a density of about 99.0% theoretical as determined by X-ray diffraction and scanning electron microscopy.

EXAMPLE 19

A green preform is prepared as in Example 17. The preform is sintered in air at 1150° C. for 11 hours.

Comparison of examples 18 and 19 shows that the 0.65PMN-0.35PT single crystal of example 18 is very dense and is free of entrapped pores. In contrast, entrapped pores are observed in the 0.65PMN-0.35PT single crystal of example 19.

The invention also may be used to manufacture PMN ferroelectric compounds per se as described below in example 20.

EXAMPLE 20

The procedure of example 1 is repeated except that only (PbCO$_3$)$_2$Pb(OH)$_2$ and MgNb$_2$O$_6$ is employed. The amount of (PbCO$_3$)$_2$Pb(OH)$_2$ is 48.1 g and the amount of MgNb$_2$O$_6$ is 18.983 g. The ratio of (PbCO$_3$)$_2$Pb(OH)$_2$ to MgNb$_2$O$_6$ is 1:0.395.

EXAMPLE 21

The procedure of example 17 is repeated except that PbTiO$_3$ single crystals are substituted for BaTiO$_3$ single crystals.

In another aspect of the invention, textured PMN-PT ceramics are produced. In this aspect, anisotropic, {001} SrTiO$_3$ single crystal templates are employed in manufacture of textured PMN-PT ceramics. In this aspect of the invention, anisotropic, {001} SrTiO$_3$ single crystal templates are mixed with a PMN-PT precursor matrix material, an organic liquid, binder and optional modifier to form a slurry. The slurry then is dried to form a powder which is sintered to form textured PMN-PT ceramics on the {001} SrTiO$_3$ single crystal templates.

The anisotropic {001} SrTiO$_3$ single crystal templates employed are produced as taught in Applicants copending application U.S. Ser. No. 09/558,049, the teachings of which are incorporated by reference in their entirety herein. As taught in application U.S. Ser. No. 09/558,049, the anisotropic {001} SrTiO$_3$ single crystal templates employed have rectangular faces which measure about 10 µm to about 40 µm in edge length, and about 2 µm to about 5 µm in thickness. The aspect ratio of length to thickness of the {001} SrTiO$_3$ single crystal templates may vary from about 1 to about 20.

As taught in Applicants copending application U.S. Ser. No. 09/558,049, the micron size anisotropically shaped SrTiO$_3$ single crystal templates are obtained by molten salt synthesis of tabular Sr$_3$Ti$_2$O$_7$ particles, followed by reaction of the tabular Sr$_3$Ti$_2$O$_7$ particles and TiO$_2$ in molten KCl. During this reaction, anisotropically shaped single crystal SrTiO$_3$ forms on the surface of the tabular Sr$_2$Ti$_3$O$_7$. The single crystal SrTiO$_3$ particles form in an epitaxial relationship with the tabular Sr$_3$Ti$_2$O$_7$ wherein the [001] of SrTiO$_3$ is parallel to the [001] of Sr$_2$Ti$_3$O$_7$. Reaction of the tabular Sr$_3$Ti$_2$O$_7$ particles and TiO$_2$ in molten KCl is driven to completion to yield unsupported, anisotropically shaped SrTiO$_3$ particles.

In manufacture of the anisotropic, {001} SrTiO$_3$ single crystal templates, the SrCO$_3$, TiO$_2$, Sr$_3$Ti$_2$O$_7$, and salts such as KCl which are employed are about 99.9% pure. Generally, however, these reactants or precursors thereof can be of commercial or a technical grade.

The reactants or precursors thereof which are employed in manufacture of the anisotropic single crystal SrTiO$_3$ templates typically have a particle size range from submicron up to about 100 µm. The reactants or precursors thereof preferably are free of large, hard aggregates of about 100 µm or more in size.

The tabular $Sr_3Ti_2O_7$ particles employed in manufacture of the $SrTiO_3$ single crystal templates typically measure about 100 μm in length and about 10 μm in thickness, preferably about 10 μm to about 40 μm in length and about 2 μm to about 5 μm in thickness, and the aspect ratio of length to thickness of the tabular $Sr_3Ti_2O_7$ particles may range from about 1 to about 20, preferably about 10.

In order to prepare the tabular $Sr_3Ti_2O_7$ particles, $SrCO_3$ and $TiO_2$ powders, each of which have a particle size of about 10 μm to about 0.1 μm, preferably about 0.1 μm, are mixed by ball milling with plastic ball media in a polar solvent such as ethanol, isopropanol, acetone, and methanol to produce a slurry. The $SrCO_3$ and $TiO_2$ may be used in molar ratios of $SrCO_3$::$TiO_2$ of from about 3.0:2.0 to about 3.3:2.0, preferably about 3.2:2.0. Mixing is continued for a time sufficient to achieve a homogenous slurry, typically about 8 hours. After completion of mixing, a salt is added to the slurry and ball milled, typically about 3 hours. The salt which is added is water soluble, has solubility for SrO and $TiO_2$, does not become incorporated into the crystals of the product phase, and has low volatility. The amount of salt added to the slurry is about 50% to about 150%, preferably about 100% of the combined weight of the $SrCO_3$ and $TiO_2$ reactants. Examples of salts which may be employed include KCl, NaCl, and mixtures thereof, preferably KCl.

The above formed slurry of $SrCO_3$, $TiO_2$ and salt is dried in air between about 25° C. to about 90° C., preferably about 85° C. The resulting dried powder is placed in a crucible such as alumina or platinum, preferably alumina. Preferably, an alumina lid is placed on top of the alumina crucible, and the edges of the lid are sealed with alumina cement to prevent evaporation of the salt. The powder in the sealed crucible is fired at about 1200° C. to about 1400° C., preferably 1300° C., for about 1 hour to about 8 hours, preferably about 4 hours. During firing, the heating rate is about 2° C./min to about 40° C./min., preferably 10° C./min. After completion of firing, the powder in the sealed crucible is cooled to room temperature at the rate of about 1° C./min to about 100° C./min., preferably about 3° C./min to about 5° C./min. The resulting tabular $Sr_3Ti_2O_7$ particles are washed with deionized water at a temperature of about 25° C. to about 99° C., preferably about 90° C., to remove about 98% or more of the salt, preferably about 99.9% or more of the salt.

The tabular $Sr_3Ti_2O_7$ particles produced as described above may be employed in a wide range of sizes and aspect ratios for reaction with $TiO_2$ to produce anisotropically shaped, single crystal $SrTiO_3$ templates. Any polymorph of $TiO_2$ may be used, preferably, fumed $TiO_2$.

The tabular $Sr_3Ti_2O_7$ particles are combined with $TiO_2$, preferably in a polar solvent such as ethanol to produce a slurry. The amounts of $Sr_3Ti_2O_7$ and $TiO_2$ are sufficient to yield a molar ratio of $Sr_3Ti_2O_7$ to $TiO_2$ of about 1:1 to about 1:1.3, preferably about 1.0:1.1. The slurry is mixed by a magnetic stirrer for about 0.5 hour to about 10 hours, preferably about 1 hour. After completion of mixing, a water-soluble salt that has solubility for SrO and $TiO_2$ has low volatility, and does not become incorporated into the crystals of the product phase is mixed with the $Sr_3Ti_2O_7$ and $TiO_2$. Preferably, the salt is added to a slurry of $Sr_3Ti_2O_7$ and $TiO_2$. Examples of useful salts include KCl, NaCl or mixtures thereof, preferably KCl. The amount of salt added is about 50% to about 150%, preferably about 100%, of the combined weight of $Sr_3Ti_2O_7$ and $TiO_2$.

The resulting slurry of $Sr_3Ti_2O_7$, $TiO_2$ and salt is dried at about 25° C. to about 75° C., preferably about 65° C., for about 1 hour to about 10 hours, preferably about 5 hours. The resulting dried powder is fired at a heating rate of about 1° C./min to about 40° C./min, preferably about 10° C./min, in an alumina crucible, preferably a covered alumina crucible, to about 700° C. to about 1400° C., preferably about 1200° C., for about 60 to about 480 minutes, preferably about 240 min. After completion of firing, the resulting fired powder in the crucible is cooled to room temperature at about 1° C./min to about 40° C./min., preferably about 5° C./min. The salt is removed from the fired powder by washing with deionized water at a temperature of about 25° C. to about 90° C., preferably about 90° C., to remove about 98% or more of the KCl, preferably about 99.9% or more of the KCl.

The anisotropically shaped, single crystal $SrTiO_3$ forms on the surface of the tabular $Sr_3Ti_2O_7$ particles by epitaxial growth. To enable epitaxial growth, the lattice mismatch between the $Sr_3Ti_2O_7$ substrate and the growing $SrTiO_3$ typically is less than about 15%. Preferably, the difference in lattice parameters between the $SrTiO_3$ and the substrate is as small as possible.

In this aspect of the invention, the reactant materials used to make the PMN-PT precursor matrix material include $(Pb(CO_3))_2Pb(OH)_2$ from Aldrich Chemical Co., fumed $TiO_2$ from DeGussa, and $MgNb_2O_6$ from H. C. Starck. Preferably, fumed $TiO_2$ is used. However, any polymorph of $TiO_2$ may be used. These reactants typically have about 99.9% purity. Generally, however, these reactants may have a purity of a technical grade.

The $Pb(CO_3)_2Pb(OH)_2$ may be employed in particle sizes less than about 6 μm, preferably less than about 5 μm, most preferably less than about 4 μm. The fumed $TiO_2$ employed typically has a specific surface area ("SSA") of more than about 30 $m^2/g$, preferably more than about 40 $m^2/g$, more preferably more than about 50 $m^2/g$. The particle sizes of the $MgNb_2O_6$ employed may have a SSA greater than about 5 $m^2/g$, preferably greater than about 6 $m^2/g$, more preferably greater than about 7.5 $m^2/g$. The $(PbCO_3)_2Pb(OH)_2$, the fumed $TiO_2$, and the $MgNb_2O_6$ employed in this aspect of the invention may be used in amounts sufficient to produce a ratio of $(PbCO_3)_2Pb(OH)_2$:$MgNb_2O_6$:fumed $TiO_2$ of about 1:0.24:0.1 to about 1:0.0.27:0.12.

The PMN-PT precursor matrix material employed can be a reactive PMN-PT precursor matrix material, a calcined PMN-PT precursor matrix material, or mixtures thereof. The particle size of the PMN-PT precursor matrix material may vary from about 0.2 μm to about 2 μm, preferably about 0.2 μm.

In manufacture of the PMN-PT matrix precursor matrix material, $(Pb(CO_3))_2Pb(OH)_2$, fumed $TiO_2$, and $MgNb_2O_6$ are ball milled with plastic ball media in deionized water to produce a milled slurry. In a first embodiment for manufacture of the PMN-PT matrix precursor matrix material, the milled slurry is dried, ground to about 50 μm to about 150 μm, preferably about 90 μm to yield a reactive PMN-PT precursor matrix material that is mixed with the $SrTiO_3$ templates. In a second embodiment for manufacture of the PMN-PT matrix precursor matrix material, the reactive PMN-PT precursor matrix material produced as in the first embodiment is calcined prior to addition of the $SrTiO_3$ templates. The PMN-PT precursor matrix material can be calcined at about 550° C. to about 800° C. for about 5 minutes to about 20 hours, preferably about 5 minutes to about 10 hours, more preferably about 700° C. for about 1 hour. In a third embodiment for manufacture of the PMN-PT matrix precursor matrix material, excess PbO in an amount of up to about 8% beyond that required to produce stoichiometric PMN-PT is added to the precursor mixture of $(Pb(CO_3))_2Pb(OH)_2$, fumed $TiO_2$, and $MgNb_2O_6$ prior to addition of $SrTiO_3$ templates.

The PMN-PT precursor matrix material is mixed with {001} $SrTiO_3$ templates and an organic liquid such as any of toluene, ethyl alcohol, acetone and water, preferably, a binder such as any of polyvinyl butyral and polyvinyl alcohol, preferably a polyvinyl butyral binder such as Ferro 73210 from the Ferro Corp., and an optional modifier such as Ferro 1111 to form a slurry. The binder may be employed in an amount of about 50 wt. % to about 70 wt % based on the weight of the PMN-PT precursor matrix material. The modifier may be used in an amount of about 0.5 wt % to about 1.5 wt %, based on the weight of the PMN-PT precursor matrix material.

The amount of organic liquid added to the PMN-PT precursor matrix material may be about 70 wt % to about 100 wt % based on the weight of the PMN-PT precursor matrix material.

The amount of {001} $SrTiO_3$ single crystal templates employed with the PMN-PT precursor matrix material may vary from about 1 vol % to about 10 vol %, preferably about 5 vol % based on the volume of the PMN-PT product produced. The size of the {001} $SrTiO_3$ templates employed with the PMN-PT precursor matrix material may vary from about 1 $\mu$m to about 50 $\mu$m in edge length, preferably about 5 $\mu$m to about 25 $\mu$m in edge length, and about 1 $\mu$m to about 10 $\mu$m in thickness, preferably about 2 $\mu$m to about 5 $\mu$m thickness. The aspect ratio of length to thickness of the {001} $SrTiO_3$ single crystal templates may vary from about 1 to about 20, preferably about 10.

The slurry of PMN-PT precursor matrix material and {001} $SrTiO_3$ single crystal templates is formed into shapes suitable for stacking into an assembly which can be compressed into a laminate. The shapes may be formed by methods such as tape casting, extrusion, roll compaction, injection molding and uniaxial pressing, preferably tape casting. The shapes used to form the assembly typically have a configuration in the form of a square.

When the shapes are formed by tape casting, excess organic liquid is evaporated to yield a slurry of a viscosity of about 100 mPa·s to about 1000 mPa·s, preferably about 150 mPa·s. Tape casting typically is performed by casting the slurry at a shear rate of about 150 s$^{-1}$ to about 500 s$^{-1}$, preferably about 360 s$^{-1}$ onto a glass substrate. Tape casting is performed with an aluminum doctor blade machine from the R.J. Carston Co. The gap used in the machine typically is about 150 $\mu$m to about 500 $\mu$m, preferably about 150 $\mu$m to about 300 $\mu$m, more preferably about 200 $\mu$m.

When tape casting, the thickness of the cast tape formed typically is about 30 $\mu$m to about 200 $\mu$m, preferably about 50 $\mu$m. The cast tape is dried at about 25° C. for about 10 hours to remove volatiles. The resulting dried tape then is cut into shapes such as squares, stacked into an assembly of 5 to 50 layers, preferably 50 layers, and uniaxially compressed under a pressure of about 2,000 PSI to about 20,000 PSI, preferably about 4,000 PSI to produce a laminate. The laminate then is heated to burnout the binder prior to sintering to yield a green preform.

The binder and organics can be removed by first heating the sample at 0.5° C./min to 200° C., holding at 200° C. for 1 h, heating at 0.35° C./min to 275° C., holding at 275° C. for 1 h, heating at 0.5° C./min to 600° C., holding at 600° C. for 1 h, and then cooling to room temperature at 2° C./min in air.

The green preform, during sintering, is heated at about 1° C./min to about 15° C./min, preferably at about 15° C./min to a sintering temperature of about 900° C. to about 1250° C., preferably about 1150° C. and held at the sintering temperature in flowing oxygen for about 1 h to about 50 h, preferably about 10 h. The resulting product is textured PMN-PT ceramic.

The following non-limiting examples 21–23 illustrate manufacture of textured PMN-PT ceramics with use of $SrTiO_3$ single crystal templates.

EXAMPLES 21–22

These Examples Illustrate Manufacture of Textured $0.675Pb(Mg_{1/3}Nb_{2/3})O_3$–$0.325$ $PbTiO_3$ (67.5 PMN-32.5PT) Ceramics Using $SrTiO_3$ Single Crystal Templates and 67.5PMN-32.5PT Reactive Precursor Matrix Material

EXAMPLE 21

A. Manufacture of 67.5PMN-32.5PT Reactive Precursor matrix material 48.774 gms $(Pb(CO_3))_2Pb(OH)_2$ of particle size less than 4 micron, 4.899 gms fumed $TiO_2$ of specific surface area of more than 50 m$^2$/gm, and 12.993 gms $MgNb_2O_6$ of a specific surface area of more than about 7.5 m$^2$/gm are mixed in a ball mill with plastic media in deionized water to produce a milled slurry. The milled slurry is dried at 80° C. for 10 hours, ground in mortar and pestle, and sieved to <90 $\mu$m (–170 mesh) to yield a reactive 67.5PMN-32.5PT precursor matrix material.

B. Manufacture of textured 67.5 PMN-32.5PT textured ceramics 15 g of the 67.5PMN-32.5PT precursor powder produced above is added to 12 g toluene, 8.25 g Ferro 73210 binder and 0.188 g Ferro 1111 modifier, and milled for 24 h using $ZrO_2$ milling media to obtain a milled slurry of a particle size of 1 $\mu$m. After milling, 0.5 g of the $SrTiO_3$ templates produced as above and which is dispersed in 10 gm toluene are added to the 67.5PMN-32.5PT precursor powder. Excess toluene is removed by evaporation while stirring with a stir bar in a beaker until the slurry reaches a viscosity of 150 mPa·s. The slurry is tape cast at a blade gap of 200 $\mu$m at a shear rate of 360 s$^{-1}$. The resulting tape is cut into squares, stacked into an assembly of 30 layers, and compressed under a pressure of 19000 PSI to yield a 1 mm thick laminated sample. The sample is heated to burn out the binder and organics to produce a green preform. The preform then is sintered.

During binder burn out to remove organics, the sample is heated at 0.5° C./min to 200° C., held at 200° C. for 1 h, heated at 0.35° C./min to 275° C., held at 275° C. for 1 h, and then heated at 0.5° C./min to 600° C. and then held at 600° C. for 1 h. The sample then is cooled to room temperature at 2° C./min in air to produce a green preform.

During sintering, the green preform is encapsulated in platinum foil and then embedded in the above formed 67.5PMN-32PT precursor matrix powder in an alumina boat. The green preform then is heated at 15° C./min to 1150° C. and held at 1150° C. for 10 h in flowing, 99% pure oxygen. The preform than is cooled at 15° C./min. to room temperature to produce textured 67.5PMN-32.5PT ceramics.

EXAMPLE 22

The procedure of example 21 is followed except that the sample is held at the sintering temperature of 1150° C. for 50 h.

The degrees of texture of the 67.5PMN-32.5PT ceramics produced in examples 21 and 22 is estimated by comparing X-ray peak intensities of textured and untextured 67.5PMN-32.5PT samples. The samples are ground using 800 mesh and 2400 mesh SiC paper prior to measurement of X-ray peak intensities and piezoelectric properties such as polarization and strain hysteresis.

Polarization and strain hysteresis measurements are performed by using a modified Sawyer-Tower circuit and a linear variable displacement transducer (LVDT) driven by a lock in amplifier (Stanford Research Systems model SR 830). Electric fields as high as 50 kV/cm are employed for strain measurements using an amplified unipolar wave at 0.1 Hz from a TREK 609C-6 high voltage D.C. amplifier. The samples were immersed in GALDEN, HT-200 insulating liquid from Galden Co. during these measurements. Samples were poled prior to strain measurements and the conditions for poling were optimized as is well known in the art. An amplified triangular waveform is used to measure polarization hysteresis.

Table 3 below compares the X-ray patterns of textured 67.5PMN-32.5PT produced as in Example 21 with random untextured 67.5PMN-32.5PT. As shown in Table 3, the textured 67.5PMN-32.5 PT of example 21 has highly developed (001) and (002) peaks and a suppressed (110) peak, which is the main peak for the random untextured 67.5PMN-32.5PT ceramic. This confirms formation of textured 67.5PMN-32.5PT.

TABLE 3

Comparison of relative peak intensities (%) of textured and untextured 67.5 PMN–32.5 PT

| Plane | Untextured 67.5 PMN–32.5 PT Sintered for 10 hrs at 1150 C. | Example 21: Textured 67.5 PMN–32.5 PT Sintered for 50 hrs at 1150 C. |
|---|---|---|
| (100) | 21 | 100 |
| (110) | 100 | 28 |
| (111) | 34 | |
| (200) | 27 | 91 |
| (210) | 10 | 7 |
| (211) | 33 | |

The microstructures of the textured 67.5PMN-32.5PT ceramics produced by sintering for 10 h and 50 h at 1150° C. as above shows that aligned, blocky grains are dispersed in a fine grain matrix. These microstructures also show the improved grain alignment that produced.

Table 4 shows the piezoelectric strain of textured 67.5PMN-32.5PT of example 21 produced by sintering for 50 h at 1150° C.

TABLE 4

Piezoelectric strain of the textured 67.5 PMN-32.5 PT of Example 21 produced by sintering for 50 h at 1150° C.

| | Strain at 10 kV/cm | Strain at 50 kV/cm | $d_{33}$ up to 10 kV/cm |
|---|---|---|---|
| Example 21: Textured 67.5 PMN-32.5 PT | 0.16% | 0.31% | 1200 pC/N |
| Untextured 67.5 PMN-32.5 PT | 0.09% | 0.15% | 580 pC/N |

The textured 67.5PMN-32.5PT of example 21-please confirm of 0.7 mm thickness is translucent. This confirms absence of porosity and absence of impurities at the grain boundaries.

EXAMPLE 22

This Example Illustrates Use of Calcined PMN-PT Precursor Matrix Material and $SrTiO_3$ Single Crystal Templates in Manufacture of Textured PMN-PT Ceramics 11.08 g of the 67.5PMN-32PT precursor matrix material prepared as in example 20 is calcined at 700° C. for 1 h. The resulting calcined precursor matrix material is added to 9 g toluene 6 g binder (Ferro 73210), 0.15 g modifier (Ferro 1111) and milled for 24 h using $ZrO_2$ milling media to yield a milled slurry. After milling, 0.41 g of $SrTiO_3$ templates prepared as above and dispersed in toluene, are added to the slurry. Samples were prepared and sintered following the procedure of Example 20.

Table 5 compares the texture development of 67.5PMN-32.5PT ceramic, as gauged by the Lotgering Factor, produced by use of reactive and calcined precursor matrix materials by sintering at 1150° C. The calcined 67.5PMN-32.5PT precursor matrix retains good reactivity when calcined at low temperature to prevent particle coarsening.

TABLE 5

Lotgering Factor of Textured 67.5 PMN–32.5 PT Produced after sintering at 1150° C. from Reactive and calcined 67.5 PMN–32.5 PT precursor matrix materials

| Sintering time (h) | Reactive 67.5 PMN–32.5 PT precursor matrix | Calcined 67.5 PMN–32.5 PT precursor matrix |
|---|---|---|
| 0 | 0.21 | 0.19 |
| 1 | 0.53 | 0.54 |
| 2 | 0.52 | 0.59 |
| 4 | 0.54 | 0.60 |
| 10 | 0.59 | 0.65 |
| 50 | 0.62 | 0.70 |

EXAMPLE 23

This Example Illustrates Manufacture of 67.5PMN-32.5 PT Textured Ceramics by Use of Excess PbO in 67.5PMN-32.5PT Precursor Matrix Material A mixture of reactive 67.5PMN-32.5 PT prepared as in example 20 is mixed with 3% excess PbO beyond that required to form a stoichiometric 67.5PMN-32.5PT.

The forgoing has been described in connection with manufacture of PMN-PT compounds, particles and sintered products thereof. It should be recognized, however, that the invention is applicable to manufacture of a wide range of compounds. For example, the invention may be used to manufacture piezoelectric compounds of solid solutions of PMN-PT which include cations of elements such as Zr, Ta, La, Fe, Mn, Ni, Zn, and W.

What is claimed is:

1. A process for preparing $(1-x)Pb(Mg_{1/3}Nb_{2/3})O_3-xPbTiO_3$ where x=0.35 comprising, mixing $(PbCO_3)_2Pb(OH)_2$ of a particle size less than about 6 μm, $MgNb_2O_6$ having a specific surface area of more than about 5 m²/g and fumed $TiO_2$ having a specific surface area of more than about 30 m²/g to form a mixture, the $(PbCO_3)_2Pb(OH)_2$, the fumed $TiO_2$, and the $MgNb_2O_6$ present in amounts sufficient to produce a ratio of $(PbCO_3)_2Pb(OH)_2:MgNb_2O_6$:fumed $TiO_2$ of about 1:0.24:0.1 to about 1:0.0.27:0.12, milling the mixture in distilled water to produce a slurry having particle size of less than about 3 μm, heat treating the slurry to produce a dried precursor powder, grinding the dried precursor powder to a size less than about 200 μm, and sintering the dried precursor powder to a temperature of about 900° C. to about 1300° C. in an atmosphere selected from the group consisting of oxygen, nitrogen and air to produce a ceramic of $(1-x)Pb(Mg_{1/3}Nb_{2/3})O_3-xPbTiO_3$ where x=0.35.

2. A process for preparing $(1-x)Pb(Mg_{1/3}Nb_{2/3})O_3-xPbTiO_3$ where x=0.35 comprising, mixing $(PbCO_3)_2Pb(OH)_2$ of a particle size less than about 4 μm, $MgNb_2O_6$ having a specific surface area of more than about 7.5 m²/g and fumed $TiO_2$ having a specific surface area of more than about 50 m²/g to form a mixture, the $(PbCO_3)_2Pb(OH)_2$, the fumed $TiO_2$, and the $MgNb_2O_6$ present in amounts sufficient to produce a ratio of $(PbCO_3)_2Pb(OH)_2:MgNb_2O_6$:fumed $TiO_2$ of about 1:0.256:0.109, milling said mixture in distilled water to produce a slurry having particle size of less than about 1 μm, heat treating the slurry to produce a dried precursor powder, grinding the dried precursor powder to produce a ground dried precursor powder of less than about 90 μm, and sintering the dried precursor powder to about 1000° C. to about 1150° C. in oxygen to produce a ceramic product of $(1-x)Pb(Mg_{1/3}Nb_{2/3})O_3-xPbTiO_3$ where x=0.35.

3. A process for preparing $(1-x)Pb(Mg_{1/3}Nb_{2/3})O_3-xPbTiO_3$ where x=0.35 comprising, mixing $(PbCO_3)_2Pb(OH)_2$ of a particle size less than about 4 μm, $MgNb_2O_6$ having a specific surface area of more than about 7.5 m²/g and fumed $TiO_2$ having a specific surface area of more than about 50 m²/g to form a mixture, the $(PbCO_3)_2Pb(OH)_2$, the fumed $TiO_2$, and the $MgNb_2O_6$ present in amounts sufficient to produce a ratio of $(PbCO_3)_2Pb(OH)_2:MgNb_2O_6$:fumed $TiO_2$ of about 1:0.256:0.109, milling said mixture in distilled water to produce a slurry having particle size of less than about 1 μm, heat treating the slurry to produce a dried precursor powder, grinding the dried precursor powder to produce a ground dried precursor powder of less than about 90 μm, and sintering the dried precursor powder to about 1000° C. to about 1150° C. in oxygen and then in nitrogen to produce a ceramic product of $(1-x)Pb(Mg_{1/3}Nb_{2/3})O_3-xPbTiO_3$ where x=0.35.

4. A process for preparing $(1-x)Pb(Mg_{1/3}Nb_{2/3})O_3-xPbTiO_3$ where x=0.35 comprising, mixing $(PbCO_3)_2Pb(OH)_2$ of a particle size less than about 6 μm, $MgNb_2O_6$ having a specific surface area of more than about 5 m²/g and fumed $TiO_2$ having a specific surface area of more than about 30 m²/g to form a mixture, the $(PbCO_3)_2Pb(OH)_2$, the fumed $TiO_2$, and the $MgNb_2O_6$ present in amounts sufficient to produce a ratio of $(PbCO_3)_2Pb(OH)_2:MgNb_2O_6$:fumed $TiO_2$ of about 1:0.24:0.1 to about 1:0.0.27:0.12, milling the mixture in distilled water to produce a slurry having particle size of less than about 3 μm, heat treating the slurry to produce a dried precursor powder, grinding the dried precursor powder to produce a ground dried precursor powder of a size less than about 200 μm, compressing the ground dried precursor powder to produce a green preform, placing the green preform in an embedding powder which can generate lead oxide during sintering of the green preform, and sintering the green preform to a temperature of about 900° C. to about 1300 ° C. in an atmosphere selected from the group consisting of oxygen, nitrogen and air to produce a ceramic of $(1-x)Pb(Mg_{1/3}Nb_{2/3})O_3-xPbTiO_3$ where x=0.35.

5. The process of claim 4 wherein the sintering of the green preform is at a temperature of about 1000° C. to about 1150° C.

6. The process of claim 5 wherein the sintering is in oxygen.

7. The process of claim 6 wherein the sintering is first in oxygen and then in nitrogen.

8. A process of manufacture of a single crystal of 0.65PMN-0.35PT comprising, mixing $(PbCO_3)_2Pb(OH)_2$ of a particle size less than about 6 μm, $MgNb_2O_6$ having a specific surface area of more than about 5 m²/g and fumed $TiO_2$ having a specific surface area of more than about 30 m²/g to form a mixture, the $(PbCO_3)_2Pb(OH)_2$, the fumed $TiO_2$, and the $MgNb_2O_6$ present in amounts sufficient to produce a ratio of $(PbCO_3)_2Pb(OH)_2:MgNb_2O_6$:fumed $TiO_2$ of about 1:0.24:0.1 to about 1:0.0.27:0.12, milling said mixture in distilled water to produce a slurry having particle size of less than about 3 μm, heat treating the slurry to produce a dried precursor powder, grinding the dried precursor powder to produce a ground dried precursor powder of a size less than about 200 μm, compressing the dried ground powder to produce a compressed preform, placing a barium titanate single crystal on the compressed preform, depositing an additional amount of the ground dried precursor powder over the barium titanate single crystal, compressing the preform having the dried precursor powder and barium titanate single crystal thereon to produce a compact, and sintering the compact to produce a single crystal of 0.65PMN-0.35PT.

9. The method of claim 8 wherein sintering is performed at 1150° C. in 99% pure oxygen for one hour followed by sintering at 1150° C. in nitrogen for ten hours.

10. The process of claim 8 wherein the lead magnesium niobate-lead titanate compound has the formula
$(1-x)Pb(Mg_{1/3}Nb_{2/3})O_3-xPbTiO_3$ where x is about 0.0 to about 0.95.

11. A process for preparing a lead magnesium niobate-lead titanate product comprising, mixing a blend including a lead-containing substance selected from the group consisting of lead acetates-lead hydroxides, lead acetates, lead hydroxides and lead carbonates with magnesium niobate and fumed titanium oxide to form a mixture, milling the mixture to produce a blend having particle size of less than about 3 µm, heat treating the blend to produce a dried precursor powder, and sintering the dried precursor powder to a temperature of about 900° C. to about 1300° C. to produce a lead magnesium niobate-lead titanate compound.

12. The process of claim 11 wherein the milling of the mixture is performed by ball milling in distilled water.

13. The process of claim 12 wherein the lead acetate-hydroxide is $Pb(CH_3COO)_2Pb(OH)_2$.

14. The process of claim 11 wherein the lead acetate is $Pb(CH_3COO)_4$.

15. The process of claim 12 wherein the lead carbonate-hydroxide is $(PbCO_3)_2Pb(OH)_2$.

16. The process according to claim 15 wherein the $(PbCO_3)_2Pb(OH)_2$ has a particle size less than about 6 µm.

17. The process according to claim 15 wherein the magnesium niobate has a specific surface area of more than about 5 m$^2$/g.

18. The process according to claim 15 wherein the fumed titania has a specific surface area of more than about 30 m$^2$/g.

19. The process of claim 18 wherein the lead magnesium niobate-lead titanate compound has the formula (1−x)Pb(Mg$_{1/3}$Nb$_{2/3}$)O$_3$–xPbTiO$_3$ where x is about 0.0 to about 0.40.

20. The process of claim 18 wherein the lead magnesium niobate-lead titanate compound has the formula (1−x)Pb(Mg$_{1/3}$Nb$_{2/3}$)O$_3$–xPbTiO$_3$ where x=0.35.

21. The process according to claim 11 wherein the blend further comprises an oxide of a metal selected from the group consisting of Zr, Ta, La, Fe, Mn, Ni, Zn, and W and mixtures thereof.

22. The process according to claim 11, wherein the blend further comprises a binder.

23. The process according to claim 22, wherein the binder is selected from the group consisting of polyvinyl alcohol, polyethylene glycol, methylcellulose, carboxymethylcellulose, ethylcellulose, hydroxpropylcellulose, polyethylene oxide base high polymers, acrylic base high polymers, maleic anhydride base high polymers, starch, gelatine, polyoxyethylene alkyl ether, polyvinyl butyrol and waxes.

24. A process of manufacture of textured 0.675PMN-0.325PT ceramic comprising, mixing $(PbCO_3)_2Pb(OH)_2$ of a particle size less than about 4 µm, MgNb$_2$O$_6$ having a specific surface area of more than about 7.5 m$^2$/g and fumed TiO$_2$ having a specific surface area of more than about 50 m$^2$/g to form a blend, milling the blend in water to produce a mixture, drying the mixture to produce a dried precursor powder, grinding the dried precursor powder to produce a ground precursor powder of a size less than about 90 µm, mixing the ground precursor powder with an organic liquid, an organic binder and SrTiO$_3$ single crystal templates to form a slurry, milling the slurry to a particle size of about 1 µm to form a milled slurry, tape casting the milled slurry to form a tape, cutting the tape into a plurality of shapes, stacking the shapes into an assembly, compressing the assembly to form a laminated sample, heating the laminated sample to burn out the binder to produce a green preform, and sintering the preform to form textured 0.675PMN-0.325PT.

25. The method of claim 24 wherein sintering is performed at 1150° C. in 99% pure oxygen for 10 hours to 50 hours.

26. The method of claim 24 wherein sintering is performed at 1150° C. in 99% pure oxygen for 10 hours.

27. The method of claim 26 wherein the heating of the sample is performed by first heating the sample at 0.5° C./min to 200° C., holding at 200° C. for 1 h, heating at 0.35° C./min to 275° C., holding at 275° C. for 1 h, heating at 0.5° C./min to 600° C., holding at 600° C. for 1 h, and then cooling to room temperature at 2° C./min in air.

28. The method of claim 27 wherein the size of the SrTiO$_3$ single crystal templates is about 1 µm to about 50 µm in edge length, and about 1 µm to about 10 µm in thickness.

29. The method of claim 27 wherein the size of the SrTiO$_3$ single crystal templates is about 5 µm to about 25 µm in edge length, and about 1 µm to about 10 µm in thickness.

30. The method of claim 27 wherein the size of the SrTiO$_3$ single crystal templates is about 5 µm to about 25 µm in edge length, about 2 µm to about 5 µm thickness.

31. The method of claim 27 wherein the ground precursor powder is calcined prior to mixing with the organic liquid.

32. The product of the process of claim 26.

33. The method of claim 24 wherein the sintering is performed in air.

34. A process of manufacture of a single crystal of 0.65PMN-0.35PT comprising, mixing $(PbCO_3)_2Pb(OH)_2$ of a particle size less than about 6 µm, MgNb$_2$O$_6$ having a specific surface area of more than about 5 m$^2$/g and fumed TiO$_2$ having a specific surface area of more than about 30 m$^2$/g to form a mixture, the $(PbCO_3)_2Pb(OH)_2$, the fumed TiO$_2$, and the MgNb$_2$O$_6$ present in amounts sufficient to produce a ratio of $(PbCO_3)_2Pb(OH)_2$:MgNb$_2$O$_6$:fumed TiO$_2$ of about 1:0.24:0.1 to about 1:0.0.27:0.12, milling said mixture in distilled water to produce a slurry having particle size of less than about 3 µm, heat treating the slurry to produce a dried precursor powder, grinding the dried precursor powder to produce a ground dried precursor powder of a size less than about 200 µm, compressing the dried ground powder to produce a compressed preform, placing a lead titanate single crystal on the compressed preform, depositing an additional amount of the ground dried precursor powder over the lead titanate single crystal, compressing the preform having the dried precursor powder and barium titanate single crystal thereon to produce a compact, and sintering the compact to produce a single crystal of 0.65PMN-0.35PT.

* * * * *